(12) United States Patent
Naik et al.

(10) Patent No.: US 9,847,289 B2
(45) Date of Patent: Dec. 19, 2017

(54) PROTECTIVE VIA CAP FOR IMPROVED INTERCONNECT PERFORMANCE

(71) Applicant: Applied Materials, Inc., Santa Clara, CA (US)

(72) Inventors: Mehul Naik, San Jose, CA (US); Paul F. Ma, Santa Clara, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 58 days.

(21) Appl. No.: 14/291,466

(22) Filed: May 30, 2014

(65) Prior Publication Data
US 2015/0348902 A1 Dec. 3, 2015

(51) Int. Cl.
*H01L 21/02* (2006.01)
*H01L 21/3065* (2006.01)
*H01L 23/522* (2006.01)
*H01L 23/528* (2006.01)
*H01L 21/306* (2006.01)
(Continued)

(52) U.S. Cl.
CPC .... *H01L 23/5226* (2013.01); *H01L 21/02068* (2013.01); *H01L 21/3065* (2013.01); *H01L 21/30604* (2013.01); *H01L 21/76807* (2013.01); *H01L 21/76846* (2013.01); *H01L 21/76877* (2013.01); *H01L 23/528* (2013.01); *H01L 23/53238* (2013.01); *H01L 23/53266* (2013.01);
(Continued)

(58) Field of Classification Search
CPC ......... H01L 21/76844; H01L 21/76843; H01L 21/76813; H01L 23/5226; H01L 23/528;
H01L 23/53238; H01L 21/76807; H01L 21/76846; H01L 21/76877; H01L 21/30604; H01L 21/3065; H01L 21/02068
See application file for complete search history.

(56) References Cited

U.S. PATENT DOCUMENTS 2,369,620 A 2/1945 Sullivan et al.
3,451,840 A 6/1969 Hough
(Continued)

FOREIGN PATENT DOCUMENTS

CN 1375575 10/2002
CN 1412861 A 4/2003
(Continued)

OTHER PUBLICATIONS

Abe et al., "Developments of plasma etching technology for fabricating semiconductor devices," Jpn. J. Appl. Phys., vol. 47, No. 3R, Mar. 2008, 21 pgs.
(Continued)

*Primary Examiner* — Maliheh Malek
(74) *Attorney, Agent, or Firm* — Kilpatrick Townsend & Stockton LLP

(57) ABSTRACT

Exemplary methods of forming a semiconductor structure may include etching a via through a semiconductor structure to expose a first circuit layer interconnect metal. The methods may include forming a layer of a material overlying the exposed first circuit layer interconnect metal. The methods may also include forming a barrier layer within the via having minimal coverage along the bottom of the via. The methods may additionally include forming a second circuit layer interconnect metal overlying the layer of material.

19 Claims, 6 Drawing Sheets

(51) Int. Cl.
*H01L 21/768* (2006.01)
*H01L 23/532* (2006.01)
*H01J 37/32* (2006.01)

(52) U.S. Cl.
CPC .. *H01L 23/53295* (2013.01); *H01J 37/32091* (2013.01); *H01L 2924/0002* (2013.01)

(56) References Cited

U.S. PATENT DOCUMENTS

| | | |
|---|---|---|
| 3,937,857 A | 2/1976 | Brummett et al. |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shloya et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,851,370 A | 7/1989 | Doklan et al. |
| 4,865,685 A | 9/1989 | Palmour |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Lowenstein et al. |
| 4,913,929 A | 4/1990 | Moslehi et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,992,136 A | 2/1991 | Tachi et al. |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,218 A | 7/1994 | Lowrey et al. |
| 5,328,558 A | 7/1994 | Kawamura et al. |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |

(56) References Cited

U.S. PATENT DOCUMENTS

| | | | |
|---|---|---|---|
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,054,380 A * | 4/2000 | Naik ................... 438/624 |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsuing et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,168 B1 * | 3/2001 | Naik et al. .................. 438/638 |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,418 B1 | 10/2001 | Cha et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |

(56) References Cited

U.S. PATENT DOCUMENTS

| | | |
|---|---|---|
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,352,081 B1 | 3/2002 | Lu et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,427,623 B2 | 8/2002 | Ko |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 * | 3/2003 | Lopatin et al. ............ 438/618 |
| 6,531,377 B2 | 3/2003 | Knorr et al. |
| 6,537,733 B2 | 3/2003 | Campana et al. |
| 6,541,374 B1 * | 4/2003 | de Felipe et al. ............ 438/648 |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,586,163 B1 | 7/2003 | Okabe et al. |
| 6,589,887 B1 * | 7/2003 | Dalton et al. ............... 438/765 |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,663,787 B1 * | 12/2003 | You et al. ................. 216/18 |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,797,652 B1 * | 9/2004 | Ngo et al. ............ 438/687 |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,852,550 B2 | 2/2005 | Tuttle et al. |
| 6,858,153 B2 | 2/2005 | Bjorkman et al. |
| 6,867,141 B2 | 3/2005 | Jung et al. |
| 6,869,880 B2 | 3/2005 | Krishnaraj et al. |
| 6,875,694 B1 * | 4/2005 | Ngo et al. ............ 438/687 |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 6,992,326 B1 * | 1/2006 | MacPherson ........ H01L 27/3246 257/40 |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,112,528 B2 * | 9/2006 | Chen et al. ............ 438/653 |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,193,327 B2 * | 3/2007 | Yu et al. ............ 257/774 |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,235,137 B2 | 6/2007 | Kitayama et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,365,016 B2 | 4/2008 | Ouellet et al. |
| 7,390,710 B2 | 6/2008 | Derderian et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,484,473 B2 | 2/2009 | Keller et al. |
| 7,488,688 B2 | 2/2009 | Seung-Pil et al. |
| 7,494,545 B2 | 2/2009 | Lam et al. |
| 7,575,007 B2 | 8/2009 | Tang et al. |

(56) References Cited

U.S. PATENT DOCUMENTS

| | | |
|---|---|---|
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,855,147 B1* | 12/2010 | Dulkin et al. ............... 438/676 |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,133,349 B1 | 3/2012 | Panagopoulos |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 8,491,805 B2 | 7/2013 | Kushibiki et al. |
| 8,642,481 B2 | 2/2014 | Wang et al. |
| 8,772,888 B2 | 7/2014 | Jung et al. |
| 8,956,980 B1 | 2/2015 | Chen et al. |
| 2001/0008803 A1 | 7/2001 | Takamatsu et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0053585 A1 | 12/2001 | Kikuchi et al. |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0098681 A1 | 7/2002 | Hu et al. |
| 2002/0124867 A1 | 9/2002 | Kim et al. |
| 2002/0129769 A1 | 9/2002 | Kim et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0003757 A1 | 1/2003 | Naltan et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087522 A1* | 5/2003 | Ngo et al. ............ 438/660 |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0119307 A1* | 6/2003 | Bekiaris et al. ............... 438/638 |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0194857 A1* | 10/2003 | Hau-Riege et al. .......... 438/637 |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0007325 A1* | 1/2004 | Pan et al. .................... 156/345.1 |
| 2004/0018714 A1* | 1/2004 | Cooney et al. ............... 438/618 |
| 2004/0033678 A1 | 2/2004 | Arghavani et al. |
| 2004/0050328 A1 | 3/2004 | Kumagai et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0121583 A1 | 6/2004 | Bao et al. |
| 2004/0126948 A1* | 7/2004 | Lee .................. H01L 21/823481 438/197 |
| 2004/0129224 A1 | 7/2004 | Yamazaki |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2004/0251548 A1* | 12/2004 | Yang .................. H01L 21/2855 257/751 |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0073051 A1 | 4/2005 | Yamamoto et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0146048 A1* | 7/2005 | Dubin ............... H01L 21/76843 257/774 |
| 2005/0170642 A1* | 8/2005 | Hineman et al. ............. 438/637 |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0214477 A1 | 9/2005 | Hanawa et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0239288 A1* | 10/2005 | Peng ................ H01L 21/76838 438/687 |
| 2005/0266622 A1 | 12/2005 | Arghavani et al. |
| 2005/0266655 A1* | 12/2005 | Nemani et al. ............... 438/435 |

(56) References Cited

U.S. PATENT DOCUMENTS

| | | | |
|---|---|---|---|
| 2005/0266679 A1* | 12/2005 | Lin | H01L 21/76805 438/637 |
| 2005/0266691 A1 | 12/2005 | Gu et al. | |
| 2005/0287771 A1 | 12/2005 | Seamons et al. | |
| 2006/0000802 A1 | 1/2006 | Kumar et al. | |
| 2006/0000805 A1 | 1/2006 | Todorow et al. | |
| 2006/0003577 A1* | 1/2006 | Sone | 438/638 |
| 2006/0011298 A1 | 1/2006 | Lim et al. | |
| 2006/0019456 A1 | 1/2006 | Bu et al. | |
| 2006/0019485 A1* | 1/2006 | Komai et al. | 438/627 |
| 2006/0019486 A1 | 1/2006 | Yu et al. | |
| 2006/0024954 A1 | 2/2006 | Wu et al. | |
| 2006/0024956 A1 | 2/2006 | Zhijian et al. | |
| 2006/0033678 A1 | 2/2006 | Lubomirsky et al. | |
| 2006/0046419 A1 | 3/2006 | Sandhu et al. | |
| 2006/0046484 A1 | 3/2006 | Abatchev et al. | |
| 2006/0051966 A1 | 3/2006 | Or et al. | |
| 2006/0051968 A1 | 3/2006 | Joshi et al. | |
| 2006/0054184 A1 | 3/2006 | Mozetic et al. | |
| 2006/0093756 A1 | 5/2006 | Rajagopalan et al. | |
| 2006/0102076 A1 | 5/2006 | Smith et al. | |
| 2006/0108320 A1* | 5/2006 | Lazovsky et al. | 216/2 |
| 2006/0130971 A1 | 6/2006 | Chang et al. | |
| 2006/0162661 A1 | 7/2006 | Jung et al. | |
| 2006/0166107 A1 | 7/2006 | Chen et al. | |
| 2006/0166515 A1 | 7/2006 | Karim et al. | |
| 2006/0178008 A1* | 8/2006 | Yeh | H01L 21/02063 438/687 |
| 2006/0185592 A1 | 8/2006 | Matsuura | |
| 2006/0191637 A1 | 8/2006 | Zajac et al. | |
| 2006/0207504 A1 | 9/2006 | Hasebe et al. | |
| 2006/0210723 A1 | 9/2006 | Ishizaka | |
| 2006/0211260 A1 | 9/2006 | Tran et al. | |
| 2006/0216923 A1 | 9/2006 | Tran et al. | |
| 2006/0223325 A1* | 10/2006 | Hamada | H01L 21/76805 438/700 |
| 2006/0226121 A1 | 10/2006 | Aoi | |
| 2006/0240661 A1 | 10/2006 | Annapragada et al. | |
| 2006/0246717 A1 | 11/2006 | Weidman et al. | |
| 2006/0251800 A1 | 11/2006 | Weidman et al. | |
| 2006/0251801 A1 | 11/2006 | Weidman et al. | |
| 2006/0252252 A1 | 11/2006 | Zhu et al. | |
| 2006/0254503 A1* | 11/2006 | Dai et al. | 117/84 |
| 2006/0261490 A1 | 11/2006 | Su et al. | |
| 2006/0264003 A1 | 11/2006 | Eun | |
| 2006/0264043 A1 | 11/2006 | Stewart et al. | |
| 2006/0266288 A1 | 11/2006 | Choi | |
| 2006/0267201 A1* | 11/2006 | Huebler et al. | 257/758 |
| 2007/0059925 A1* | 3/2007 | Choi | H01L 21/76843 438/640 |
| 2007/0071888 A1 | 3/2007 | Shanmugasundram et al. | |
| 2007/0072408 A1 | 3/2007 | Enomoto et al. | |
| 2007/0077749 A1* | 4/2007 | Frohberg | C23C 14/046 438/618 |
| 2007/0090325 A1 | 4/2007 | Hwang et al. | |
| 2007/0099428 A1 | 5/2007 | Shamiryan et al. | |
| 2007/0099431 A1 | 5/2007 | Li | |
| 2007/0099438 A1 | 5/2007 | Ye et al. | |
| 2007/0107750 A1 | 5/2007 | Sawin et al. | |
| 2007/0108404 A1 | 5/2007 | Stewart et al. | |
| 2007/0111519 A1 | 5/2007 | Lubomirsky et al. | |
| 2007/0117396 A1 | 5/2007 | Wu et al. | |
| 2007/0123051 A1 | 5/2007 | Arghavani et al. | |
| 2007/0163440 A1 | 7/2007 | Kim et al. | |
| 2007/0181057 A1 | 8/2007 | Lam et al. | |
| 2007/0193515 A1 | 8/2007 | Jeon et al. | |
| 2007/0197012 A1* | 8/2007 | Yang et al. | 438/597 |
| 2007/0197028 A1 | 8/2007 | Byun et al. | |
| 2007/0232071 A1 | 10/2007 | Balseanu et al. | |
| 2007/0238321 A1 | 10/2007 | Futase et al. | |
| 2007/0243685 A1 | 10/2007 | Jiang et al. | |
| 2007/0269976 A1 | 11/2007 | Futase et al. | |
| 2007/0281106 A1 | 12/2007 | Lubomirsky et al. | |
| 2008/0020570 A1* | 1/2008 | Naik | 438/675 |
| 2008/0044990 A1 | 2/2008 | Lee | |
| 2008/0075668 A1 | 3/2008 | Goldstein | |
| 2008/0081483 A1 | 4/2008 | Wu | |
| 2008/0085604 A1 | 4/2008 | Hoshino et al. | |
| 2008/0099431 A1 | 5/2008 | Kumar et al. | |
| 2008/0105977 A1* | 5/2008 | Luce et al. | 257/751 |
| 2008/0115726 A1 | 5/2008 | Ingle et al. | |
| 2008/0124919 A1 | 5/2008 | Huang et al. | |
| 2008/0124937 A1 | 5/2008 | Xu et al. | |
| 2008/0142483 A1 | 6/2008 | Hua et al. | |
| 2008/0142831 A1 | 6/2008 | Hua et al. | |
| 2008/0153306 A1 | 6/2008 | Cho et al. | |
| 2008/0160210 A1 | 7/2008 | Yang et al. | |
| 2008/0162781 A1 | 7/2008 | Haller et al. | |
| 2008/0179747 A1* | 7/2008 | Sakai | H01L 21/76805 257/751 |
| 2008/0182381 A1 | 7/2008 | Kiyotoshi | |
| 2008/0182382 A1 | 7/2008 | Ingle et al. | |
| 2008/0182383 A1 | 7/2008 | Lee et al. | |
| 2008/0202892 A1 | 8/2008 | Smith et al. | |
| 2008/0230519 A1 | 9/2008 | Takahashi | |
| 2008/0233709 A1 | 9/2008 | Conti et al. | |
| 2008/0261404 A1 | 10/2008 | Kozuka et al. | |
| 2008/0268645 A1 | 10/2008 | Kao et al. | |
| 2008/0292798 A1 | 11/2008 | Huh et al. | |
| 2009/0004849 A1 | 1/2009 | Eun | |
| 2009/0017227 A1 | 1/2009 | Xinyu Fu et al. | |
| 2009/0020883 A1* | 1/2009 | Nomura | H01L 21/76831 257/774 |
| 2009/0045167 A1 | 2/2009 | Maruyama | |
| 2009/0053426 A1* | 2/2009 | Lu et al. | 427/540 |
| 2009/0104738 A1 | 4/2009 | Ring et al. | |
| 2009/0104764 A1 | 4/2009 | Xia et al. | |
| 2009/0104782 A1 | 4/2009 | Lu et al. | |
| 2009/0155487 A1* | 6/2009 | Belyansky | H01L 21/67115 427/558 |
| 2009/0170221 A1 | 7/2009 | Jacques et al. | |
| 2009/0189246 A1 | 7/2009 | Wu et al. | |
| 2009/0197404 A1* | 8/2009 | Yang | H01L 21/02063 438/652 |
| 2009/0202721 A1 | 8/2009 | Nogami et al. | |
| 2009/0218691 A1* | 9/2009 | Yang | H01L 21/76805 257/751 |
| 2009/0236232 A1* | 9/2009 | Kanki | 205/157 |
| 2009/0255902 A1 | 10/2009 | Satoh et al. | |
| 2009/0275205 A1 | 11/2009 | Kiehlbauch et al. | |
| 2009/0275206 A1 | 11/2009 | Katz et al. | |
| 2009/0277874 A1 | 11/2009 | Rui et al. | |
| 2009/0280650 A1 | 11/2009 | Lubomirsky et al. | |
| 2009/0283413 A1* | 11/2009 | Sato | 205/143 |
| 2010/0048027 A1 | 2/2010 | Cheng et al. | |
| 2010/0055917 A1 | 3/2010 | Kim | |
| 2010/0059889 A1 | 3/2010 | Gosset et al. | |
| 2010/0072622 A1* | 3/2010 | Yang | H01L 21/2855 257/751 |
| 2010/0075503 A1 | 3/2010 | Bencher et al. | |
| 2010/0081272 A1 | 3/2010 | Jang et al. | |
| 2010/0093151 A1 | 4/2010 | Arghavani et al. | |
| 2010/0098884 A1 | 4/2010 | Balseanu et al. | |
| 2010/0099236 A1 | 4/2010 | Kwon et al. | |
| 2010/0099263 A1 | 4/2010 | Kao et al. | |
| 2010/0101727 A1 | 4/2010 | Ji | |
| 2010/0105209 A1 | 4/2010 | Winniczek et al. | |
| 2010/0144140 A1 | 6/2010 | Chandrashekar et al. | |
| 2010/0173499 A1 | 7/2010 | Tao et al. | |
| 2010/0178755 A1 | 7/2010 | Lee et al. | |
| 2010/0187534 A1 | 7/2010 | Nishi et al. | |
| 2010/0187588 A1 | 7/2010 | Gil-Sub et al. | |
| 2010/0187694 A1 | 7/2010 | Yu et al. | |
| 2010/0190352 A1 | 7/2010 | Jaiswal | |
| 2010/0207205 A1 | 8/2010 | Grebs et al. | |
| 2010/0301491 A1* | 12/2010 | Yang | H01L 21/02063 257/773 |
| 2010/0320604 A1* | 12/2010 | Isobayashi | H01L 21/76805 257/751 |
| 2010/0330814 A1 | 12/2010 | Yokota et al. | |
| 2011/0008950 A1 | 1/2011 | Xu | |
| 2011/0011338 A1 | 1/2011 | Chuc et al. | |

(56) References Cited

U.S. PATENT DOCUMENTS

| | | | |
|---|---|---|---|
| 2011/0017499 A1* | 1/2011 | Yang | H01L 21/76846 174/257 |
| 2011/0034035 A1 | 2/2011 | Liang et al. | |
| 2011/0053380 A1 | 3/2011 | Sapre et al. | |
| 2011/0081782 A1 | 4/2011 | Liang et al. | |
| 2011/0124144 A1 | 5/2011 | Schlemm et al. | |
| 2011/0136339 A1 | 6/2011 | Gambino et al. | |
| 2011/0143542 A1 | 6/2011 | Feurprier et al. | |
| 2011/0151674 A1 | 6/2011 | Tang et al. | |
| 2011/0151676 A1 | 6/2011 | Ingle et al. | |
| 2011/0151677 A1 | 6/2011 | Wang et al. | |
| 2011/0151678 A1 | 6/2011 | Ashtiani et al. | |
| 2011/0155181 A1 | 6/2011 | Inatomi | |
| 2011/0159690 A1 | 6/2011 | Chandrashekar et al. | |
| 2011/0163062 A1* | 7/2011 | Gordon | C23C 16/18 216/13 |
| 2011/0165771 A1 | 7/2011 | Ring et al. | |
| 2011/0169017 A1* | 7/2011 | Stainer | H01L 27/3248 257/88 |
| 2011/0180847 A1 | 7/2011 | Ikeda et al. | |
| 2011/0195575 A1 | 8/2011 | Wang | |
| 2011/0217851 A1 | 9/2011 | Liang et al. | |
| 2011/0226734 A1 | 9/2011 | Sumiya et al. | |
| 2011/0230052 A1 | 9/2011 | Tang et al. | |
| 2011/0266252 A1 | 11/2011 | Thadani et al. | |
| 2011/0294300 A1 | 12/2011 | Zhang et al. | |
| 2012/0003782 A1 | 1/2012 | Byun et al. | |
| 2012/0009796 A1 | 1/2012 | Cui et al. | |
| 2012/0061839 A1 | 3/2012 | Kahlert et al. | |
| 2012/0068242 A1 | 3/2012 | Shin et al. | |
| 2012/0077344 A1* | 3/2012 | Zhou et al. | 438/702 |
| 2012/0135576 A1 | 5/2012 | Lee et al. | |
| 2012/0164839 A1 | 6/2012 | Nishimura | |
| 2012/0196447 A1 | 8/2012 | Yang et al. | |
| 2012/0211462 A1 | 8/2012 | Zhang et al. | |
| 2012/0238102 A1 | 9/2012 | Zhang et al. | |
| 2012/0238103 A1 | 9/2012 | Zhang et al. | |
| 2012/0248608 A1* | 10/2012 | Yoo | H01L 23/53238 257/751 |
| 2012/0285621 A1 | 11/2012 | Tan | |
| 2012/0292664 A1 | 11/2012 | Kanike | |
| 2012/0309204 A1 | 12/2012 | Kang et al. | |
| 2013/0005140 A1 | 1/2013 | Jeng et al. | |
| 2013/0023122 A1* | 1/2013 | Nemani et al. | 438/702 |
| 2013/0023123 A1* | 1/2013 | Zhou et al. | 438/702 |
| 2013/0023124 A1* | 1/2013 | Nemani et al. | 438/703 |
| 2013/0034968 A1 | 2/2013 | Zhang et al. | |
| 2013/0045605 A1 | 2/2013 | Wang et al. | |
| 2013/0052827 A1 | 2/2013 | Wang et al. | |
| 2013/0052833 A1 | 2/2013 | Ranjan et al. | |
| 2013/0059440 A1 | 3/2013 | Wang et al. | |
| 2013/0089988 A1 | 4/2013 | Wang et al. | |
| 2013/0093089 A1* | 4/2013 | Yang | H01L 21/76846 257/751 |
| 2013/0119483 A1 | 5/2013 | Alptekin et al. | |
| 2013/0134494 A1* | 5/2013 | Hong | H01L 23/53238 257/316 |
| 2013/0157467 A1* | 6/2013 | Chen | H01L 21/0271 438/702 |
| 2013/0187220 A1 | 7/2013 | Surthi | |
| 2013/0213469 A1* | 8/2013 | Kramer | H01L 31/022458 136/256 |
| 2013/0244422 A1* | 9/2013 | Zhang | H01L 21/28556 438/653 |
| 2013/0260533 A1 | 10/2013 | Sapre et al. | |
| 2013/0273733 A1* | 10/2013 | Tang et al. | 438/643 |
| 2013/0284369 A1 | 10/2013 | Kobayashi et al. | |
| 2013/0284370 A1 | 10/2013 | Kobayashi et al. | |
| 2013/0302980 A1 | 11/2013 | Chandrashekar et al. | |
| 2013/0334691 A1* | 12/2013 | Farooq | H05K 3/423 257/751 |
| 2013/0334700 A1* | 12/2013 | Singh | H01L 23/5222 257/774 |
| 2014/0035142 A1* | 2/2014 | Yang et al. | 257/751 |
| 2014/0038311 A1* | 2/2014 | Kim et al. | 438/3 |
| 2014/0061916 A1* | 3/2014 | Saito | H01L 23/5226 257/751 |
| 2014/0097538 A1 | 4/2014 | Zhao et al. | |
| 2014/0213060 A1* | 7/2014 | Kao et al. | 438/703 |
| 2014/0263272 A1 | 9/2014 | Duan et al. | |
| 2014/0299988 A1* | 10/2014 | Cabral, Jr. | H01L 21/76846 257/751 |
| 2015/0048511 A1* | 2/2015 | Tsai | H01L 21/76865 257/763 |
| 2015/0056800 A1* | 2/2015 | Mebarki et al. | 438/652 |
| 2015/0056814 A1* | 2/2015 | Ling et al. | 438/705 |
| 2015/0079798 A1* | 3/2015 | Ling et al. | 438/714 |
| 2015/0079799 A1* | 3/2015 | Nemani et al. | 438/714 |
| 2015/0108646 A1* | 4/2015 | Chae | H01L 23/5226 257/751 |
| 2015/0126028 A1* | 5/2015 | Ryan | H01L 21/76883 438/653 |
| 2015/0152366 A1* | 6/2015 | Shimada | H01L 21/02063 438/618 |
| 2015/0179579 A1* | 6/2015 | Jezewski | H01L 21/76846 257/753 |
| 2015/0187670 A1* | 7/2015 | Ono | H01L 21/02063 257/741 |
| 2015/0203961 A1* | 7/2015 | Ha | C23C 16/045 427/124 |
| 2015/0210966 A1* | 7/2015 | Shimada | G03F 7/425 438/703 |
| 2015/0228585 A1* | 8/2015 | He | H01L 23/53238 257/751 |
| 2015/0262870 A1* | 9/2015 | Lin | H01L 23/5226 257/751 |
| 2015/0262938 A1* | 9/2015 | Lin | H01L 23/53238 257/751 |
| 2015/0270156 A1* | 9/2015 | Lin | H01L 21/743 257/622 |
| 2015/0270215 A1* | 9/2015 | Peng | H01L 23/5226 257/751 |
| 2017/0148868 A1* | 5/2017 | Lindert | H01L 28/75 |
| 2017/0162502 A1* | 6/2017 | Chi | H01L 23/5226 |
| 2017/0183607 A1* | 6/2017 | Shimada | C11D 11/0047 |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | H11-204442 | 7/1999 |
| JP | 2000-012514 A | 1/2000 |
| JP | 2001-308023 | 11/2001 |
| JP | 2002-100578 | 4/2002 |
| JP | 2002-141349 | 5/2002 |

(56) References Cited

FOREIGN PATENT DOCUMENTS

| JP | 2002-222861 A | 8/2002 |
|---|---|---|
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2005-033023 A | 2/2005 |
| JP | 2007-173383 A | 7/2007 |
| JP | 08-148470 A | 6/2008 |
| JP | 2009-044129 A | 2/2009 |
| KR | 10-0155601 B1 | 12/1998 |
| KR | 10-0236219 B1 | 12/1999 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 | 8/2001 |
| KR | 10-2003-0054726 A | 7/2003 |
| KR | 1020030096140 | 12/2003 |
| KR | 10-2004-0049739 A | 6/2004 |
| KR | 10-2004-0096365 A | 11/2004 |
| KR | 1020050042701 A | 5/2005 |
| KR | 10-0681390 | 9/2006 |
| KR | 10-2008-0013174 A | 2/2008 |
| KR | 1020080063988 A | 7/2008 |
| KR | 10-2009-0080533 A | 7/2009 |
| KR | 10-2010-0013980 A | 2/2010 |
| KR | 10-2010-0074508 A | 7/2010 |
| KR | 10-2010-0075957 A | 7/2010 |
| KR | 10/2010/0083629 A | 7/2010 |
| KR | 10-2010-0099535 A | 9/2010 |
| KR | 10-2011-0086540 A | 7/2011 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 99/62108 A2 | 12/1999 |
| WO | 00/13225 A1 | 3/2000 |
| WO | 00/22671 | 4/2000 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2011/087580 A1 | 7/2011 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

Cho et al., "Dielectric-barrier microdischarge structure for efficient positive-column plasma using a thick-film ceramic sheet," IEEE Trans. Plasma Sci., vol. 37, No. 8, Aug. 2009, 4 pgs.

Cho, T.S., "Dual Discharge Modes Operation of an Argon Plasma Generated by Commercial Electronic Ballast for Remote Plasma Removal Process," IEEE Transactions on Plasma Science, vol. 42, No. 6 Jun. 2014, 4 pages.

Cho et al., "Three-dimensional spatiotemporal behaviors of light emission from discharge plasma of alternating current plasma display panels," Appl. Phys. Lett., vol. 92, No. 22, Jun. 2008, 3pgs.

Cho et al., "Analysis of address discharge modes by using a three-dimensional plasma display panel," IEEE Trans. Plasma Sci., vol. 36, Oct. 2008, 4 pgs.

C.K. Hu, et al. "Reduced Electromigration of Cu Wires by Surface Coating" Applied Physics Letters, vol. 81, No. 10, Sep. 2, 2002-pp. 1782-1784.

European Search Report dated May 23, 2006 for EP Application No. 05251143.3.

European Examination Report dated Nov. 13, 2007 for EP Application No. 05251143.3.

EP Partial Search Report, Application No. 08150111.601235/1944796, dated Aug. 22, 2008.

Eze, F. C., "Electroless deposition of CoO thin films," J. Phys. D: Appl. Phys. 32 (1999), pp. 533-540.

Galiano et al. "Stress-Temperature Behavior of Oxide Films Used for Intermetal Dielectric Applications", VMIC Conference, Jun. 9-10, 1992, pp. 100-106.

Goebels, F.J. et al. "Arbitrary Polarization from Annular Slot Planar Antennas." Ire Transactions on Antennas and Propagation, Jul. 1961, 8 pgs.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report of PCT/US2009/059743 dated Apr. 26, 2010, 4 pages.

International Search Report of PCT/US2012/061726 dated May 16, 2013, 3 pages.

International Search Report of PCT/2013/052039 dated Nov. 8, 2013, 9 pages.

International Search Report of PCT/2013/037202 dated Aug. 23, 2013, 11 pages.

Kim et al., "Pendulum electrons in micro hollow cathode discharges," IEEE Trans. Plasma Sci., vol. 36, No. 4, pp. Aug. 2008, 2 pgs.

Lin, et al., "Manufacturing of Cu Electroless Nickel/Sn—Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

Musaka, "Single Step Gap Filling Technology fo Subhalf Micron Metal Spacings on Plasma Enhanced $TEOS/O_2$ Chemical Vapor Deposition System," Extended Abstracts of the 1993 International Conference on Solid State Devices and Materials pages, 1993, 510-512.

Pearlstein, Fred. "Electroless Plating," J. Res. Natl. Bur. Stan., Ch. 31 (1974), pp. 710-747.

Redolfi et al., "Bulk FinFET fabrication with new approaches for oxide topography control using dry removal techniques," Solid-State Electron., vol. 71, May 2012, 7 pgs.

Saito, et al., "Electroless deposition of Ni—B, Co—B and Ni—Co—B alloys using dimethylamineborane as a reducing agent," Journal of Applied Electrochemistry 28 (1998), pp. 559-563.

Schacham-Diamond, et al., "Electrochemically deposited thin film alloys for ULSI and MEMS applications," Microelectronic Engineering 50 (2000), pp. 525-531.

Schacham-Diamond, et al. "Material properties of electroless 100-200 nm thick CoWP films," Electrochemical Society Proceedings, vol. 99-34, pp. 102-110.

Schoenbach et al.,"High-pressure hollow cathode discharges," Plasma Sources Sci. Technol.,vol. 6, No. 4, Nov. 1997, 10 pgs.

Smayling, et al., "APF® Pitch-Halving for 2nm Logic Cells using Gridded Design Rules", proceedings of the SPIE, 2008, 8 pages.

Vassiliev, et al., "Trends in void-free pre-metal CVD dielectrics," Solid State Technology, Mar. 2001, pp. 129-136.

Weston, et al., "Ammonium Compounds," Kirk-Othmer Encyclopedia of Chemical Technology, 2003,30 pages see pp. 717-718, John Wiley & Sons, Inc.

Yasaka, Y. et al. "Planar microwave discharges with active control of plasma uniformity". Physics of Plasmas, vol. 9 No. 3, Mar. 2002, 7 pgs.

(56) References Cited

OTHER PUBLICATIONS

Yosi Shacham-Diamond, et al. "High Aspect Ratio Quarter-Micron Electroless Copper Integrated Technology", Microelectronic Engineering 37/38 (1997) pp. 77-88.
Abraham, "Reactive Facet Tapering of Plasma Oxide for Multilevel Interconnect Applications", IEEE, V-MIC Conference, Jun. 15-16, 1987, pp. 115-121.
Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pp.
Chang et al. "Frequency Effects and Properties of Plasma Deposited Fluorinated Silicon Nitride", J. Vac Sci Technol B 6(2), Mar./Apr. 1988, pp. 524-532.
Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
Examination Report dated Jun. 28, 2010 for European Patent Application No. 05251143.3. I.
Fukada et al., "Preparation of SiOF Films with Low Dielectric Constant by ECR Plasma CVD," ISMIC, DUMIC Conference, Feb. 21-22, 1995, pp. 43-49.
Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority dated Jul. 3, 2008 (PCT/US05/46226).
International Search Report and Written Opinion for PCT Application No. PCT/US2011/027221, dated Nov. 1, 2011, 8 pages.
International Search Report and Written Opinion of PCT/US2010/057676 dated Jun. 27, 2011, 9 pages.
International Search Report and Written Opinion of PCT/US2011/030582 dated Dec. 7, 2011, 9 pages.
International Search Report and Written Opinion of PCT/US2011/064724 dated Oct. 12, 2012, 8 pages.
International Search Report and Written Opinion of PCT/US2012/028952 dated Oct. 29, 2012, 9 pages.
International Search Report and Written Opinion of PCT/US2012/048842 dated Nov. 28, 2012, 10 pages.
International Search Report and Written Opinion of PCT/US2012/053329 dated Feb. 15, 2013, 8 pages.
International Search Report and Written Opinion of PCT/US2012/057294 dated Mar. 18, 2013, 12 pages.
International Search Report and Written Opinion of PCT/US2012/057358 dated Mar. 25, 2013, 10 pages.
International Search Report and Written Opinion of PCT/US2012/058818 dated Apr. 1, 2013, 9 pages.
International Search Report and Written Opinion of the International Searching Authority for PCT Application No. PCT/US2012/028957, dated Oct. 18, 2012, 9 pages.
International Search report and Written Opinion of PCT/CN2010/000932 dated Mar. 31, 2011, 8 pages.
Japanese Patent Office, Official Action for Application No. 2007-317207 dated Dec. 21, 2011, 2 pages.
International Search Report and Written Opinion of PCT/US2013/076217 dated Apr. 28, 2014, 11 pages.
Jung, et al., "Patterning with amorphous carbon spacer for expanding the resolution limit of current lithography tool", Proc. SPIE , 2007, 9 pages, vol. 6520, 65201C.
Laxman, "Low ∈ Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.
Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Qian, et al., "High Density Plasma Deposition and Deep Submicron Gap Fill with Low Dielectric Constant SiOF Films," ISMIC, DUMIC Conference Feb. 21-22, 1995, 1995, pp. 50-56.
Robles, et al. "Effects of RF Frequency and Deposition Rates on the Moisture Resistance of PEVCD TEOS-Based Oxide Films", ECS Extended Abstracts, Abstract No. 129, May 1992, pp. 215-216, vol. 92-1.
Shapiro, et al. "Dual Frequency Plasma CVD Fluorosilicate Glass: Water Absorption and Stability", ISMIC, DUMIC Conference Feb. 21-22, 1995, 1995. pp. 118-123.
S.M. Sze, VLSI Technology, McGraw-Hill Book Company, pp. 107, 108.
C.C. Tang and D. W. Hess, Tungsten Etching in CF4 and SF6 Discharges, J. Electrochem. Soc., 1984, 131 (1984) p. 115-120.
Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.
Wang et al.; Ultra High-selectivity silicon nitride etch process using an inductively coupled plasma source; J. Vac. Sci. Techno!. A 16(3), May/Jun. 1998, pp. 1582-1587.
Wolf et al.; Silicon Processing for the VLSI Era; vol. 1; 1986; Lattice Press, pp. 546, 547, 618, 619.
Yang, R., "Advanced in situ pre-Ni silicide (Siconi) cleaning at 65 nm to resolve defects in NiSix modules," J. Vac. Sci., Technol. B, Microelectron. Nanometer Struct., vol. 28, No. 1, Jan. 2010, 6 pgs.
Yasuda et al., "Dual-function remote plasma etching/cleaning system applied to selective etching of Si02 and removal of polymeric residues," J. Vac. Sci. Technol., A, vol. 11, No. 5, 1993, 12 pgs.
Yu, et al., "Step Coverage Study of Peteos Deposition for Intermetal Dielectric Applications," abstract, VMIC conference, Jun. 12-13, 1990, 7 pages, No. 82.
Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.
Derwent 2006-065772, Formation of multilayer enscapulating film over substrate, e.g. displace device, comprising delivering mixture precursors and hydrogen gas into substrate processing system, 2006.
International Search Report and Written Opinion of PCT/US2015/033340 dated Aug. 31, 2015, 13 pages.

* cited by examiner

PROTECTIVE VIA CAP FOR IMPROVED INTERCONNECT PERFORMANCE

TECHNICAL FIELD

The present technology relates to semiconductor systems, processes, and equipment. More specifically, the present technology relates to systems, methods, and structures for improving interconnect structures to reduce electromigration.

BACKGROUND

Integrated circuits may include more than one million micro-electronic field effect transistors that are formed on a substrate and cooperate to perform various functions within the circuit. Reliably producing sub-half micron and smaller features is one of the key technologies for the next generation of very-large-scale integration ("VLSI") and ultra-large-scale integration ("ULSI") of semiconductor devices. However, as the limits of integrated circuit technology are pushed and extended vertically, the shrinking dimensions of interconnects in VLSI and ULSI technology have placed additional demands on processing capabilities. Reliable formation of the vias and interconnects is important to integrated circuit success and to the continued effort to increase circuit density and quality of individual substrates and die.

As feature sizes have reduced, so have the interconnects and vias electrically connecting the various structures. However, safety features included with interconnects and vias may cause steep increases in line resistance and resistive-capacitive delay throughout the circuit structure. Additionally, electromigration can become increasingly destructive as feature sizes shrink.

Thus, there is a need for improved systems and methods that can be used to produce high quality devices and structures. These and other needs are addressed by the present technology.

SUMMARY

Systems, structures, and processes are provided for improving interconnect and via performance. The systems may provide configurations for components that allow multiple processes to be performed without changing environment or exposing structures to ambient conditions. The structures may include integrated circuit structures that may reduce electromigration. The methods may provide for the limiting of atomic movement in interconnects or across interconnects.

Exemplary methods of forming a semiconductor structure may include etching a via through a semiconductor structure, where the etching exposes a first metal. The methods may include forming a layer of material over the exposed first metal, and may further include forming a second metal over the layer of material. The layer of material may include a transition metal or a transition metal oxide in embodiments, and the layer of material may be formed to a thickness of between about 0.5 nm and about 10 nm in embodiments. The methods may further include forming a barrier layer within the etched via prior to forming the second metal overlying the layer of material. The barrier may be deposited to a first thickness along the sidewalls of the via, and to a second thickness less than the first thickness over the layer of material. In disclosed embodiments the via may include no other materials besides the second metal and barrier layer. In embodiments the barrier layer may include a transition metal such as manganese, and at least one of the first metal and the second metal may include copper.

In disclosed embodiments the first metal may be an interconnect for a first level of a semiconductor structure, and the second metal may be an interconnect for a second level of a semiconductor structure. The etching operation may include contacting a portion of the semiconductor structure with non-reactive ions from a capacitively-coupled plasma, and then exposing the contacted portion of the semiconductor structure to a plasma-generated reactive species. The etching operation may be performed as part of a single or dual damascene process, and the semiconductor structure may be maintained under vacuum between the etching operation and the layer of material forming operation.

Methods of forming a protective cap within an integrated circuit structure are also disclosed and include etching a via through a semiconductor structure. The semiconductor structure may include at least a first circuit layer and a second circuit layer, and the etching may be performed through the second circuit layer to expose an interconnect metal in the first circuit layer. The methods may include cleaning the interconnect metal, and may also include forming a cobalt-containing protective cap overlying the exposed first metal. The methods may still further include forming a barrier layer including manganese along the sidewalls of the via. During the formation, the barrier layer may be formed overlying the cobalt-containing protective cap to a thickness of less than 50% of the thickness deposited along the sidewalls of the via. In disclosed embodiments, the barrier layer may have a thickness at the sidewalls of less than or about 10 nm. The methods may also include filling the via with copper directly overlying the barrier layer.

Semiconductor structures are also disclosed and may include a first layer of dielectric material, and a first conductive layer disposed at least partially within the first layer of dielectric. The structures may include a second layer of dielectric material, as well as a second conductive layer disposed at least partially within the second layer of dielectric. The structures may also include a third conductive layer disposed between the first conductive layer and the second conductive layer. The third conductive layer may include a conductive material different from the material comprising the first conductive layer or the second conductive layer. Exemplary structures may include the second conductive layer having a first portion having a first width and a second portion having a second width less than the first width. The second portion may be disposed closer to the first conductive layer than the first portion. The structure may also include a third layer of dielectric material positioned between the first layer of dielectric material and the second layer of dielectric material. The third conductive layer may be positioned between the first layer of dielectric material and the third layer of dielectric material in disclosed embodiments. The third conductive layer may include a first thickness at a position between the first layer of dielectric material and the third layer of dielectric material, and a second thickness different from the first thickness at a position between the first conductive layer and the second conductive layer.

Such technology may provide numerous benefits over conventional systems and techniques. For example, as electromigration is reduced, device lifetime may be increased. An additional advantage is that improved systems may reduce queue times and device oxidation or corrosion. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
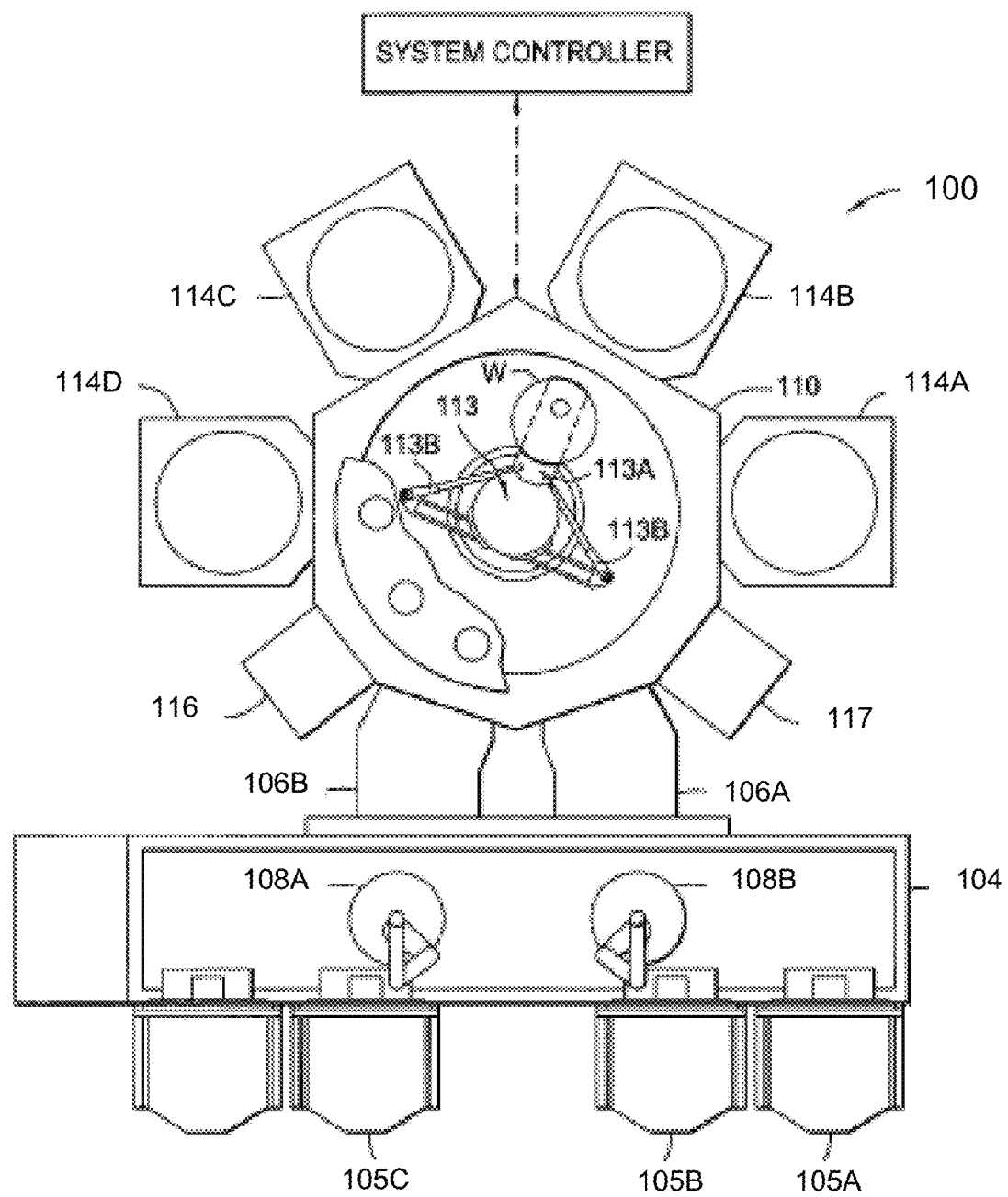
FIG. 1 shows a top plan view of an exemplary processing system according to the present technology.

Certain figures are included as schematics. It is to be understood that the figures are for illustrative purposes, and are not to be considered of scale unless specifically stated to be as such.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems, structures, and methods for improving interconnect and via performance, and overall electrical performance for integrated circuit ("IC") devices. With the decrease in semiconductor feature size, many issues including electrical issues can arise. Many IC devices utilize copper or tungsten as the via and interconnect metal within and between the device layers. Utilizing copper as the via and interconnect metal, for example, often includes the use of a barrier layer within trenches and vias to limit copper diffusion into the surrounding layers, which can otherwise cause shorting and device failures. Additionally, as device features as well as interconnect trenches and vias shrink in size, the interconnect metal may suffer from incomplete fill based on the high aspect ratios within the trenches.

Conventional technologies have often dealt with this degradation by utilizing liners to improve gap fill. However, the more barrier and liner material included within the trenches and vias, the less copper fills the volume. Because copper is more conductive than the barrier and liner materials, the less copper that is in the via or trench, the greater the effective resistance, which when compounded throughout what may be multiple layers of the device, can substantially affect the overall resistive-capacitive ("RC") delay. These issues may be handled by thinning the barriers and even removing liners, however in so doing the device may suffer from poor electromigration characteristics as will be discussed below with FIGS. 3-4. The present technology, on the other hand, utilizes a cap layer and may use barrier-less via bottom effects to provide both the back stress in order to compensate for the electromigration effects, as well as a minimum amount of non-copper material within the via to minimize via and line resistances. Accordingly, the methods and structures described herein provide improved performance and cost benefits over many conventional designs. These and other benefits will be described in detail below.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone.

FIG. 1 shows a top plan view of one embodiment of a processing system 100 of deposition, etching, baking, and curing chambers according to embodiments. The processing tool 100 depicted in FIG. 1 may contain a plurality of process chambers, 114A-D, a transfer chamber 110, a service chamber 116, an integrated metrology chamber 117, and a pair of load lock chambers 106A-B. The process chambers may include structures or components similar to those described in relation to FIG. 2, as well as additional processing chambers including a deposition chamber.

To transport substrates among the chambers, the transfer chamber 110 may contain a robotic transport mechanism 113. The transport mechanism 113 may have a pair of substrate transport blades 113A attached to the distal ends of extendible arms 113B, respectively. The blades 113A may be used for carrying individual substrates to and from the process chambers. In operation, one of the substrate transport blades such as blade 113A of the transport mechanism 113 may retrieve a substrate W from one of the load lock chambers such as chambers 106A-B and carry substrate W to a first stage of processing, for example, an etching process as described below in chambers 114A-D. If the chamber is occupied, the robot may wait until the processing is complete and then remove the processed substrate from the chamber with one blade 113A and may insert a new substrate with a second blade (not shown). Once the substrate is processed, it may then be moved to a second stage of processing, which may include a deposition operation, a treatment operation, etc. For each move, the transport mechanism 113 generally may have one blade carrying a substrate and one blade empty to execute a substrate exchange. The transport mechanism 113 may wait at each chamber until an exchange can be accomplished.

Once processing is complete within the process chambers, the transport mechanism 113 may move the substrate W from the last process chamber and transport the substrate W to a cassette within the load lock chambers 106A-B. From the load lock chambers 106A-B, the substrate may move into a factory interface 104. The factory interface 104 generally may operate to transfer substrates between pod loaders 105A-D in an atmospheric pressure clean environment and the load lock chambers 106A-B. The clean environment in factory interface 104 may be generally provided through air filtration processes, such as HEPA filtration, for example. Factory interface 104 may also include a substrate orienter/aligner (not shown) that may be used to properly align the substrates prior to processing. At least one substrate robot, such as robots 108A-B, may be positioned in factory interface 104 to transport substrates between various positions/locations within factory interface 104 and to other locations in communication therewith. Robots 108A-B may be configured to travel along a track system within enclosure 104 from a first end to a second end of the factory interface 104.

The processing system 100 may further include an integrated metrology chamber 117 to provide control signals, which may provide adaptive control over any of the processes being performed in the processing chambers. The integrated metrology chamber 117 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Figure 2:
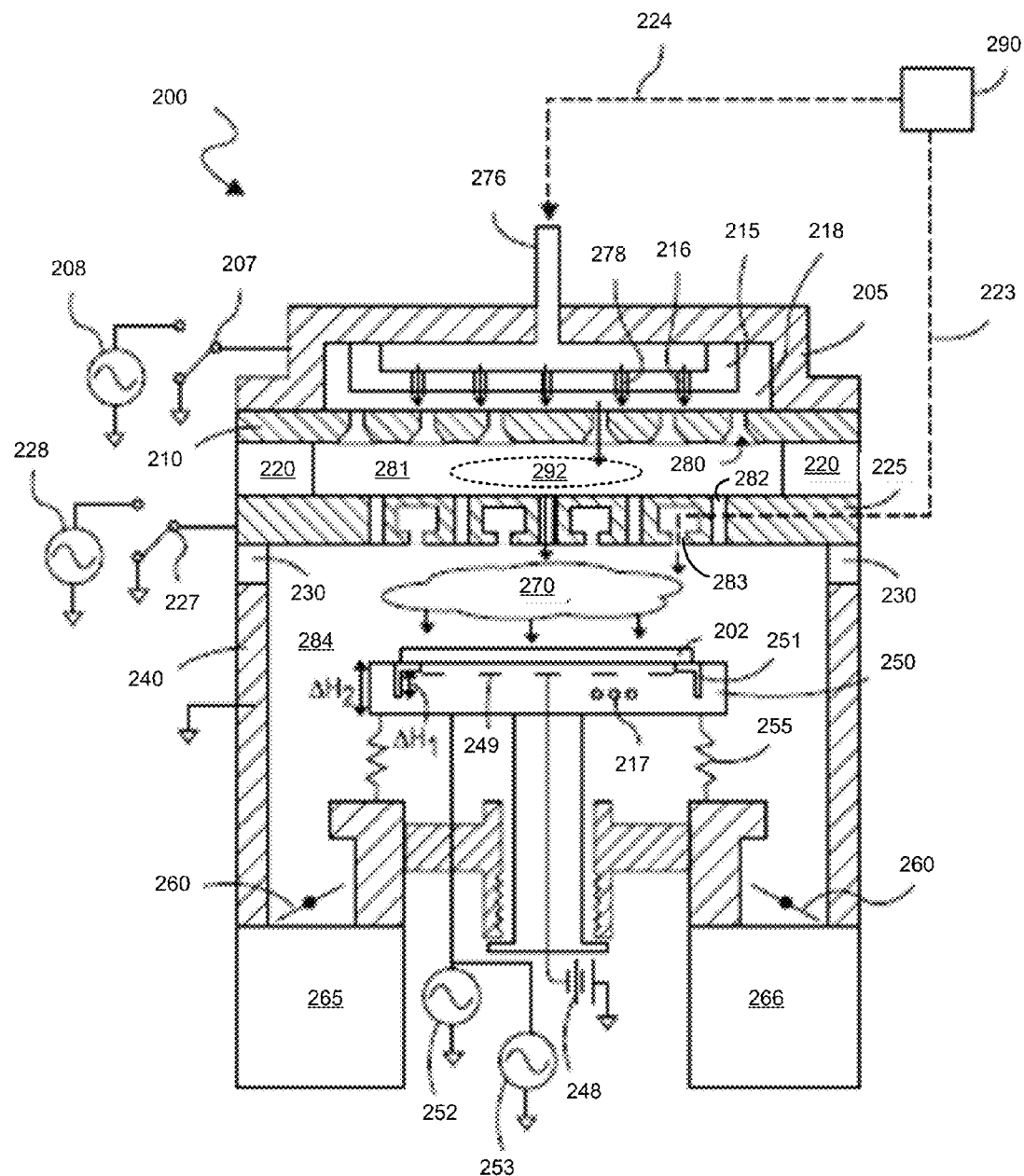
FIG. 2 shows a schematic cross-sectional view of an exemplary processing chamber according to the present technology.

Turning now to FIG. 2 is shown a cross-sectional view of an exemplary process chamber system 200 according to the present technology. Chamber 200 may be used, for example, in one or more of the processing chamber sections 114 of the system 100 previously discussed Generally, the etch chamber 200 may include a first capacitively-coupled plasma source to implement an ion-milling operation and a second capacitively-coupled plasma source to implement an etching operation and to implement an optional deposition operation. The chamber 200 may include grounded chamber walls 240 surrounding a chuck 250. In embodiments, the chuck 250 may be an electrostatic chuck that clamps the substrate 202 to a top surface of the chuck 250 during processing, though other clamping mechanisms as would be known may also be utilized. The chuck 250 may include an embedded heat exchanger coil 217. In the exemplary embodiment, the heat exchanger coil 217 includes one or more heat transfer fluid channels through which heat transfer fluid, such as an ethylene glycol/water mix, may be passed to control the temperature of the chuck 250 and ultimately the temperature of the substrate 202.

The chuck 250 may include a mesh 249 coupled to a high voltage DC supply 248 so that the mesh 249 may carry a DC bias potential to implement the electrostatic clamping of the substrate 202. The chuck 250 may be coupled with a first RF power source and in one such embodiment, the mesh 249 may be coupled with the first RF power source so that both the DC voltage offset and the RF voltage potentials are coupled across a thin dielectric layer on the top surface of the chuck 250. In the illustrative embodiment, the first RF power source may include a first and second RF generator 252, 253. The RF generators 252, 253 may operate at any industrially utilized frequency, however in the exemplary embodiment the RF generator 252 may operate at 60 MHz to provide advantageous directionality. Where a second RF generator 253 is also provided, the exemplary frequency may be 2 MHz.

With the chuck 250 to be RF powered, an RF return path may be provided by a first showerhead 225. The first showerhead 225 may be disposed above the chuck to distribute a first feed gas into a first chamber region 284 defined by the first showerhead 225 and the chamber wall 240. As such, the chuck 250 and the first showerhead 225 form a first RF coupled electrode pair to capacitively energize a first plasma 270 of a first feed gas within a first chamber region 284. A DC plasma bias, or RF bias, resulting from capacitive coupling of the RF powered chuck may generate an ion flux from the first plasma 270 to the substrate 202, e.g., Ar ions where the first feed gas is Ar, to provide an ion-milling plasma. The first showerhead 225 may be grounded or alternately coupled with an RF source 228 having one or more generators operable at a frequency other than that of the chuck 250, e.g., 13.56 MHz or 60 MHz. In the illustrated embodiment the first showerhead 225 may be selectably coupled to ground or the RF source 228 through the relay 227 which may be automatically controlled during the etch process, for example by a controller (not shown). In disclosed embodiments, chamber 200 may not include showerhead 225 or dielectric spacer 220, and may instead include only baffle 215 and showerhead 210.

As further illustrated in the figure, the etch chamber 200 may include a pump stack capable of high throughput at low process pressures. In embodiments, at least one turbo molecular pump 265, 266 may be coupled with the first chamber region 284 through one or more gate valves 260 and disposed below the chuck 250, opposite the first showerhead 225. The turbo molecular pumps 265, 266 may be any commercially available pumps having suitable throughput and more particularly may be sized appropriately to maintain process pressures below or about 10 mTorr or below or about 5 mTorr at the desired flow rate of the first feed gas, e.g., 50 to 500 sccm of Ar where argon is the first feedgas. In the embodiment illustrated, the chuck 250 may form part of a pedestal which is centered between the two turbo pumps 265 and 266, however in alternate configurations chuck 250 may be on a pedestal cantilevered from the chamber wall 240 with a single turbo molecular pump having a center aligned with a center of the chuck 250.

Disposed above the first showerhead 225 may be a second showerhead 210. In one embodiment, during processing, the first feed gas source, for example, Argon delivered from gas distribution system 290 may be coupled with a gas inlet 276, and the first feed gas flowed through a plurality of apertures 280 extending through second showerhead 210, into the second chamber region 281, and through a plurality of apertures 282 extending through the first showerhead 225 into the first chamber region 284. An additional flow distributor or baffle 215 having apertures 278 may further distribute a first feed gas flow 216 across the diameter of the etch chamber 200 through a distribution region 218. In an alternate embodiment, the first feed gas may be flowed directly into the first chamber region 284 via apertures 283 which are isolated from the second chamber region 281 as denoted by dashed line 223.

Chamber 200 may additionally be reconfigured from the state illustrated to perform an etching operation. A secondary electrode 205 may be disposed above the first showerhead 225 with a second chamber region 281 there between. The secondary electrode 205 may further form a lid or top plate of the etch chamber 200. The secondary electrode 205 and the first showerhead 225 may be electrically isolated by a dielectric ring 220 and form a second RF-coupled electrode pair to capacitively discharge a second plasma 292 of a second feed gas within the second chamber region 281. Advantageously, the second plasma 292 may not provide a significant RF bias potential on the chuck 250. At least one electrode of the second RF coupled electrode pair may be coupled with an RF source for energizing an etching plasma. The secondary electrode 205 may be electrically coupled with the second showerhead 210. In an exemplary embodiment, the first showerhead 225 may be coupled with a ground plane or floating and may be coupled to ground through a relay 227 allowing the first showerhead 225 to also be powered by the RF power source 228 during the ion-milling mode of operation. Where the first showerhead 225 is grounded, an RF power source 208, having one or more RF generators operating at 13.56 MHz or 60 MHz, for example, may be coupled with the secondary electrode 205 through a relay 207 which may allow the secondary electrode 205 to also be grounded during other operational modes, such as during an ion-milling operation, although the secondary electrode 205 may also be left floating if the first showerhead 225 is powered.

A second feed gas source, such as nitrogen trifluoride, and a hydrogen source, such as ammonia, may be delivered from gas distribution system 290, and coupled with the gas inlet 276 such as via dashed line 224. In this mode, the second feed gas may flow through the second showerhead 210 and may be energized in the second chamber region 281. Reactive species may then pass into the first chamber region 284 to react with the substrate 202. As further illustrated, for embodiments where the first showerhead 225 is a multi-channel showerhead, one or more feed gases may be provided to react with the reactive species generated by the second plasma 292. In one such embodiment, a water source may be coupled with the plurality of apertures 283.

In an embodiment, the chuck 250 may be movable along the distance H2 in a direction normal to the first showerhead 225. The chuck 250 may be on an actuated mechanism surrounded by a bellows 255, or the like, to allow the chuck 250 to move closer to or farther from the first showerhead 225 as a means of controlling heat transfer between the chuck 250 and the first showerhead 225, which may be at an elevated temperature of 80° C.-150° C., or more. As such, an etch process may be implemented by moving the chuck 250 between first and second predetermined positions relative to the first showerhead 225. Alternatively, the chuck 250 may include a lifter 251 to elevate the substrate 202 off a top surface of the chuck 250 by distance H1 to control heating by the first showerhead 225 during the etch process. In other embodiments, where the etch process is performed at a fixed temperature such as about 90-110° C. for example, chuck displacement mechanisms may be avoided. A system controller (not shown) may alternately energize the first and second plasmas 270 and 292 during the etching process by alternately powering the first and second RF coupled electrode pairs automatically.

The chamber 200 may also be reconfigured to perform a deposition operation. A plasma 292 may be generated in the second chamber region 281 by an RF discharge which may be implemented in any of the manners described for the second plasma 292. Where the first showerhead 225 is powered to generate the plasma 292 during a deposition, the first showerhead 225 may be isolated from a grounded chamber wall 240 by a dielectric spacer 230 so as to be electrically floating relative to the chamber wall. In the exemplary embodiment, an oxidizer feed gas source, such as molecular oxygen, may be delivered from gas distribution system 290, and coupled with the gas inlet 276. In embodiments where the first showerhead 225 is a multi-channel showerhead, any metal-containing precursor, such as silicon-containing precursors or other metal-containing precursors for example, may be delivered from gas distribution system 290, and directed into the first chamber region 284 to react with reactive species passing through the first showerhead 225 from the plasma 292. Alternatively the precursor may also be flowed through the gas inlet 276 along with the oxidizer.

Figure 3:
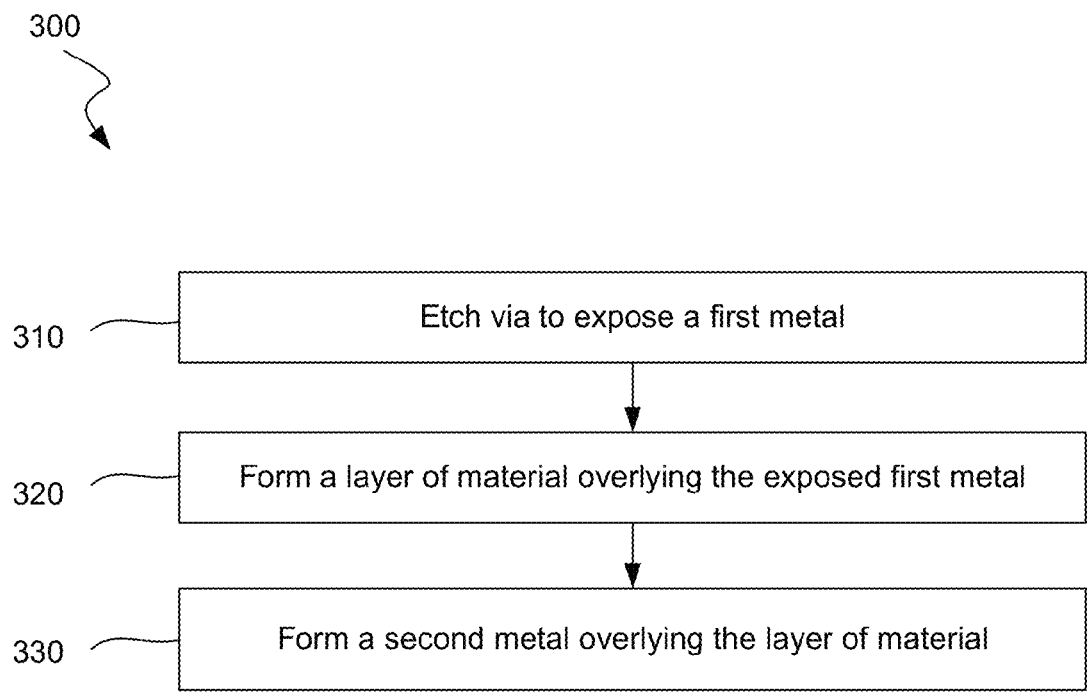
FIG. 3 shows a method of forming a selective metal cap over an interconnect metal according to embodiments of the disclosed technology.

FIG. 3 shows a method 300 of forming a semiconductor structure with improved electrical characteristics according to the present technology. Method 300 may be performed at least partially in chamber 200, for example, or may be performed in one or more other process chambers configured to perform etching and/or deposition operations. The one or more chambers may be contained in a single process tool in disclosed embodiments, such as process tool 100 previously described. By maintaining the one or more chambers within a single tool, the semiconductor device may be maintained within a conditioned environment. For example, the process tool may maintain a vacuum environment, and by maintaining the device within the tool environment at all times during processing, the device may not be exposed to ambient air. Because copper and other metals may oxidize or corrode in ambient conditions including humid environments, device quality may be improved by performing all operations within a single tool environment. Accordingly, in disclosed embodiments, the semiconductor structure may be maintained under a vacuum between the etching operation and the formation of the layer of material.

The method 300 may begin by performing an etching operation 310 on a semiconductor structure. The semiconductor structure may include one or more IC layers, at least two for example, and may include at least one metallization layer such as in a bottom circuit structure in disclosed embodiments. Etching operation 310 may form a via through one or more layers of material in order to expose a first metal, such as the metallization layer, in the lower layer. Method 300 may also include forming a layer of material over the exposed first metal in operation 320. The layer of material may include a material different from the first metal in disclosed embodiments, and may include a conductive and/or metal-containing material. Method 300 may further include forming a second metal over the layer of material in operation 330, and the second metal may be the same or different from the first metal in disclosed embodiments. For example, the first and second metal may both be copper or tungsten in embodiments, and may be any other fill material utilized for electrical connections such as vias or interconnects in disclosed embodiments. In one embodiment, both the first metal and second metal may be copper, and the first metal forms the interconnect structure for a first level of a semiconductor structure or IC layer, and the second metal forms the interconnect for a second level of a semiconductor structure or IC layer.

The layer of material formed in operation 320 may include a conductive material or metal in disclosed embodiments. For example, the conductive material may include a transition metal or a transition metal oxide, e.g. including cobalt, manganese, tungsten, etc. Additionally, the conductive material may be selected based on the interconnect or fill metal used. For example, if cobalt were used as the fill metal, then a different metal may be used for the conductive material, such as tungsten or copper or some other metal, to avoid having the same material for both the interconnect metal and the conductive material or cap material. In disclosed embodiments the conductive material may include cobalt, ruthenium, tantalum, etc. among various other metals and transition metals. In one embodiment the conductive material includes cobalt, which may be formed in a layer over the exposed first metal, such as an interconnect metal including copper in a lower IC layer. The conductive material may be deposited by any of a variety of deposition techniques including cyclic depositions or direct depositions by any of several known methods including vapor depositions, thermal depositions, and/or plasma depositions. In disclosed embodiments, the particular precursors of the material may be selected to deposit or form the layer of material on the exposed interconnect metal, without any or minimal formation along the sidewalls of the trench or via sidewalls.

In some embodiments, the layers may be formed with a plasma or may be exposed to a plasma after formation, such as by igniting hydrogen gas, ammonia, or some other reducing precursor or combination in situ or remotely from the processing chamber. The conductive material may be deposited by thermal decomposition of a metallic source gas, such as cobalt, carried by an inert gas. A reducing gas may be co-flowed or alternately pulsed into the processing chamber along with the metallic source gas. The substrate may be heated to a temperature within a range from about 50° C. to about 600° C., such as from about 100° C. to about 500° C., such as from about 200° C. to about 400° C. Alternatively, the layer or layers of material may be deposited by exposing the substrate to a metallic source gas, such as a cobalt source gas, in an ALD or CVD process including various plasma-enhanced CVD and/or ALD processes.

The metallic compound may include one or more cobalt materials in disclosed embodiments, and the cobalt materials, e.g., metallic cobalt or cobalt alloys, contained within the layer of material may be formed by CVD or ALD processes utilizing suitable cobalt precursors which include cobalt carbonyl complexes, cobalt amidinates compounds, cobaltocene compounds, cobalt dienyl complexes, cobalt nitrosyl complexes, derivatives thereof, complexes thereof, plasmas thereof, or combinations thereof.

In some embodiments, cobalt carbonyl compounds or complexes may be utilized as cobalt precursors for forming the cobalt materials during the vapor deposition process. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L may be absent, one ligand, or multiple ligands that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, butylacetylene, nitrosyl, ammonia, derivatives thereof, complexes thereof, plasmas thereof, or combinations thereof.

In another embodiment, cobalt amidinates or cobalt amido complexes may be utilized as cobalt precursors for forming the cobalt materials during the vapor deposition process. Cobalt amido complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di(butyldimethylsilyl)amido) cobalt, bis(di(ethyldimethylsilyl)amido) cobalt, bis(di(propyldimethylsilyl)amido) cobalt, bis(di(trimethylsilyl)amido) cobalt, tris(di(trimethylsilyl)amido) cobalt, derivatives thereof, complexes thereof, plasmas thereof, or combinations thereof.

Exemplary cobalt precursors include methylcyclopentadienyl cobalt bis(carbonyl), ethylcyclopentadienyl cobalt bis(carbonyl), pentamethylcyclopentadienyl cobalt bis(carbonyl), dicobalt octa(carbonyl), nitrosyl cobalt tris(carbonyl), bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasmas thereof, or combinations thereof.

In some examples, alternative reagents, including reducing agents, may be used with cobalt precursors for forming the cobalt materials during the vapor deposition process as described herein. These alternative reagents may include hydrogen (e.g., $H_2$ or atomic-H), nitrogen (e.g., $N_2$ or atomic-N), ammonia ($NH_3$), hydrazine ($N_2H_4$), a hydrogen and ammonia mixture, borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

The cobalt-containing material may be deposited having a thickness within a range from about 2 Å to about 100 Å, such as from about 10 Å to about 40 Å. In other embodiments, a cobalt oxide layer may be formed by oxidizing at least a portion of the cobalt-containing material during a surface oxidation process. In one embodiment, cobalt oxide is formed from an upper portion of the cobalt-containing layer. In disclosed embodiments, the cobalt-containing layer may be completely oxidized or substantially oxidized and therefore consumed to form a layer of cobalt oxide.

Etching operation 310 may include formation of both a trench and a via in disclosed embodiments. For example, the etching operation 310 may include formation of a wider trench as well as a narrower via that extends to the lower metal layer. The etching operation may also be performed through one or more layers of dielectric material or etch stop layers, for example, and may be performed continuously or in discrete intervals in disclosed embodiments. For example, etching operation 310 may be performed in a chamber capable of performing an ion-milling operation followed by an etching operation, such as chamber 200 described above. Additionally, multiple etch chambers may be utilized. For example, an etch operation may be performed for trench and via opening by mask layers that may be stopped at an etch stop layer between an upper and a lower IC layer. An ion-milling and etch operation as described above may then be performed to open the etch stop layer to expose the underlying metal. Operation 310 may include contacting a portion of the semiconductor structure with non-reactive ions from a capacitively-coupled plasma such as described above, and then exposing the contacted portion of the semiconductor structure to a plasma-generated reactive species. In this way, the etching process 310 may be performed selectively for each layer through which the etch is to be performed, and may be caused to cease prior to damage of underlying layers, which may allow the layer of material to be deposited in a different order.

The processes of method 300 may be part of a damascene process including a single or dual damascene process in disclosed embodiments. Selective metal caps may be formed subsequent to the formation of the underlying IC layer. After the following or upper layers are formed, trench and via etching may extend to the interconnect metal in the underlying layer. Due to imperfect processes, such an etch may etch through the selective metal cap portion formed above the first level interconnect metal. As will be explained below, this may cause electromigration issues. Utilizing the ion-milling and etch process described, however, the etching may be tuned by utilizing particular chemistries to stop upon reaching the cobalt layer without causing damage to that layer. In disclosed embodiments, the cobalt material may be reacted to form a surface-level byproduct that will not etch during the etching process. Once the etching operation is complete, the wafer may be moved closer to a heating element, for example, to cause sublimation of the byproducts to expose the underlying cobalt. Additional cobalt-containing material may be deposited over the thin selective metal cap formed, or repair may be made to the layer in the event it is damaged during the etching process 310.

After the layer of material has been deposited, the method 300 may also include forming a barrier layer within the etched via and/or trench prior to forming the second metal overlying the layer of material. The barrier layer may include a number of materials including metal, non-metal, transition metal, or poor metal materials, a non-exclusive list including manganese, tantalum, nickel, etc. The barrier material may include a transition metal as well as a transition metal-containing material such as a nitride, oxide, carbide, boride, etc., such as manganese nitride, for example. The material may include a variety of alloys or other materials such as ceramic or ceramic-like materials or any other material that may be suitable to reduce or prevent copper, tungsten, or other interconnect materials from diffusing into the surrounding materials. Although disclosed embodiments may include forming a liner within the trench, disclosed embodiments may include no other materials within the trench and/or via besides the second metal, such as copper. As explained above, the less volume that is occupied by the interconnect metal, the greater the resistance through the layers, and the greater the delay of the device and power loss throughout the structure. Accordingly, the present technology may maximize the volume within the trench that is occupied by the via conductor.

The barrier material may be formed in a number of ways including physical deposition and/or CVD or ALD processes, as well as electroless (E-less) or other formation processes. In disclosed embodiments, the barrier material may include manganese, such as manganese nitride or silicate for example, that is deposited by CVD. By using such a process, a bottomless via fill may be performed, in which there is complete or substantially complete coverage of the sidewall, but minimal or reduced coverage at the bottom of the via, such as overlying the cobalt-containing layer. For example, the barrier layer may be deposited to a first thickness along the sidewalls of the via, and to a second thickness less than the first thickness over the layer of material formed. This may help to further maximize the fill metal, such as copper fill in the via, by minimizing the additional material within the space. However, the inventors have determined effects that may be caused by the bottomless via phenomenon which may have an impact on electromigration.

Bottomless via scenarios may appear beneficial due the lower resistance provided with reduced coverage. However, electromigration problems may surface due to the reduced coverage between the lower-level interconnect metal and upper-level interconnect metal. Put another way, electromigration issues focus on both the electron flux as well as the motion of fill metal atoms, such as copper atoms. Where there is little or no interface between the upper-level copper and lower-level copper, or between any two similar metals utilized for the upper and lower interconnect metals and via metal, electromigration flux may increase inducing the metal atoms to move. This may cause voids to form in the interconnect structure, which may hasten device failure. Conventional techniques recommend utilizing short interconnects, such as less than 50 μm in length, which may provide sufficient back stress from a back stress stop to compensate for any electron flux that can actually move copper atoms. However, as shown in FIG. 4, this may not be sufficient.

Figure 4:
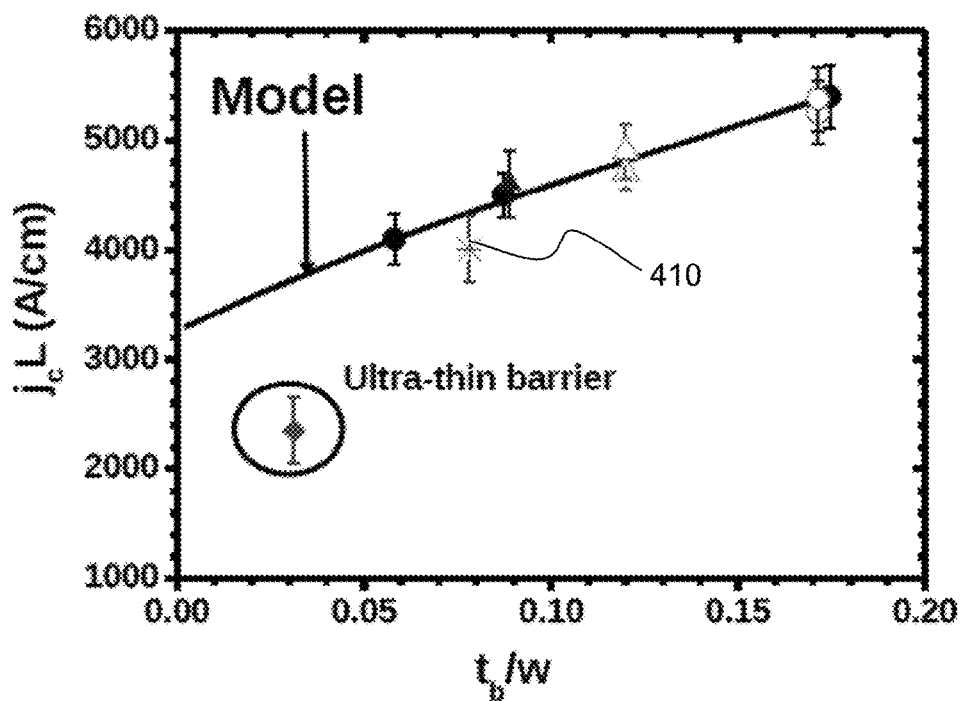
FIG. 4 shows a graphical model of projected critical current density effect with reduced barrier thickness.
Figure 5:
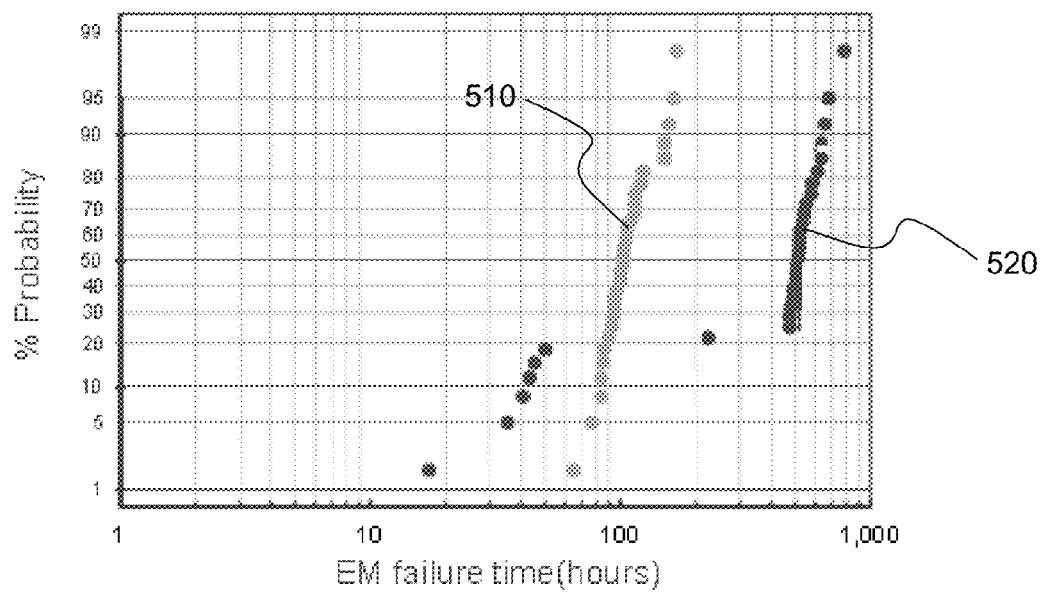
FIG. 5 shows a graph of a bi-modal distribution of electromigration failure times for multiple barrier materials.

FIG. 4 illustrates a model of projected critical current density effect with reduced barrier thickness. However, testing has shown that the model fails as barrier width is scaled. As shown at position 410 for a 10 nm thick barrier, the model fails as critical current density is substantially reduced illustrating that short interconnect length when scaled still fails to overcome electromigration and shortened device lifetimes. On the other end of the spectrum for long interconnects, such as greater than 200 μm, a different phenomenon may occur. FIG. 5 shows electromigration failure testing measurements for a control barrier 510 and for a bottomless via formation of manganese nitride 520. Control barrier 510 indicates a lower time to failure, while bottomless via barrier 520 tested over a seven-fold improvement, which would indicate a much improved design.

However, further testing showed that this is actually a false signal developed from movement due to electromigration. The structures providing the seemingly higher electromigration failure time was actually degrading the underlying structure. Generally, electromigration may cause voids to form in the upper surface due to the direction of electron flux. However, where the bottomless via barrier was used and the upper and lower interconnect metals contacted, the flux actually caused copper to be pulled from the lower IC layer creating voids and structure breakage in the lower layer. Although the device appeared to continue to operate during failure testing, this was in actuality due to the movement of copper atoms from the lower layer to the upper layer, indicating device failure may actually occur much earlier.

Surprisingly, though, the inventors have determined that by combining the cap layer over the lower level interconnect metal, while also utilizing the bottomless via barrier, the cap layer may provide back stress balancing the electron flux to prevent copper atom movement, while additionally reducing the via and line resistance by reducing the thickness and amount of material utilized for the barrier. Copper may then fill a greater volume of the via and trench, which can help to reduce via resistance and overall RC delay throughout the device. It is to be understood that although copper is routinely identified as a fill metal, any known fill metal or conductive metal may be used including tungsten, cobalt, etc.

Figure 6:
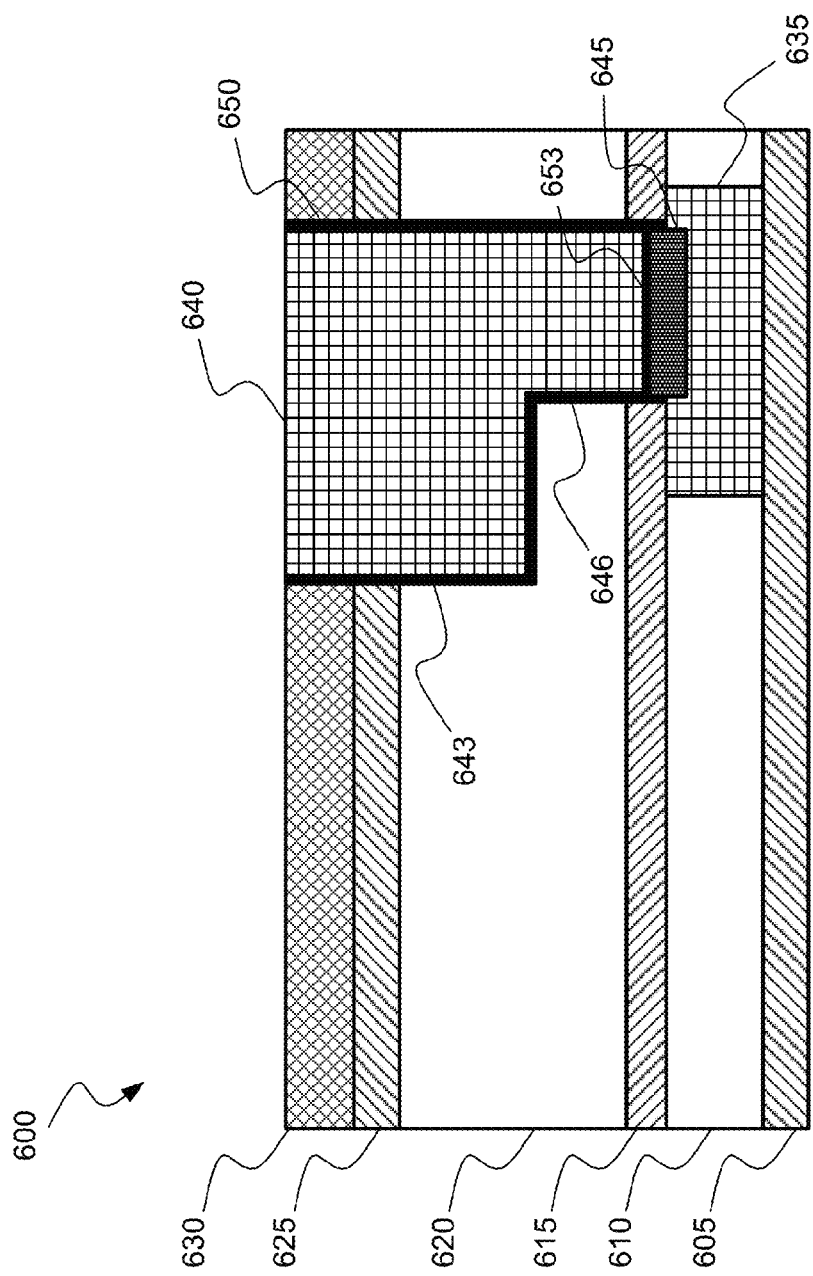
FIG. 6 shows an exemplary cross-sectional structure of a portion of an integrated circuit including a selective metal cap according to embodiments of the disclosed technology.

FIG. 6 illustrates an exemplary cross-sectional structure of a portion of an integrated circuit 600 including a selective metal cap according to embodiments of the disclosed technology. Structure 600 may be formed by any of the methods discussed elsewhere in this document, and may be formed in any of the chambers or process tools discussed herein, for example, among a number of other known processes and chambers for lithography, deposition, and etching. The figure illustrates a partially manufactured dual damascene interconnect structure according to the disclosed technology. It will be readily understood, however, that the present technology may be applied to simpler as well as more complex structures including other dual and single damascene processes. It will also be understood that IC devices often include multiple dual damascene structures for which the present techniques may be employed, and thus the technology should not be considered limited by this figure.

The structure of IC 600 includes two layers of structure and exemplary layers that may be included. More or less layers are also encompassed including more or less dielectric layers, features, devices, etch stop layers, etc. Structure 600 as illustrated includes a lower layer including a bottom dielectric 605, a first layer of dielectric material or interlayer dielectric 610, and upper dielectric 615, which may be an etch stop layer in disclosed embodiments. The dielectric layers may include any of a variety of low-k dielectrics including silicon-based dielectrics including nitrides, oxides, carbides, etc. Lower layer also includes metallization layer 635, which may be a first conductive layer disposed at least partially within the first layer of dielectric, and which may be a copper interconnect metal for example. In disclosed embodiments, the lower layer may also include a selective cap or third conductive layer that may be formed between dielectric layers 610, 615 subsequent to polishing of metal 635 and dielectric layer 610.

For the upper structure, the device may include a second layer of dielectric 620, as well as an upper dielectric or etch stop layer 625, as well as optional hard mask layer 630, for example. Second layer of dielectric 620 may be overlying the dielectric layer 615, which may be considered a third dielectric layer disposed in between the first and second dielectric layers. A second conductive layer 640, which may include both upper interconnect and via material, may be disposed at least partially within the second layer of dielectric 620. Conductive layer 640 may include a first or upper portion 643 having a first width and a second or lower portion 646 having a second width less than the first width. As illustrated, the second portion 646 may be disposed closer to the first conductive layer than the first portion 643. In disclosed embodiments, the trench 643 may be etched separately from the via 646, and the structure may be formed in multiple etching operations.

A third conductive layer 645 may be disposed between the first conductive layer 635 and the second conductive layer 640. The third conductive layer 645 may include a conductive material different from the material included in the first conductive layer or the second conductive layer. Any of the previously discussed materials or methods may be used in structure 600, and in one embodiment first and second conductive layers may include copper, and third conductive layer 645 may include cobalt, for example. Structure 600 may also include a barrier layer at least partially disposed on the sidewalls 650 of the trench and via. The barrier may or may not also include coverage 653 over the third conductive material 645. In embodiments, the barrier layer may have a sidewall thickness of less than or about 20 nm, and may be less than or about 15 nm, 10 nm, 9 nm, 8 nm, 7 nm, 6 nm, 5 nm, 4 nm, 3 nm, 2 nm, 1 nm, etc. The barrier layer may include one or more materials such as a including a material and a nitride of that material, or two different materials. In disclosed embodiments, the barrier may include less coverage in region 653, and may include a thickness of barrier that is less than, equal to, or about 90% the coverage of the sidewalls 650, and may be less than, equal to, or about 80%, 70%, 60%, 50%, 40%, 30%, 20%, 10%, 5%, 1%, or any other number or smaller range included in those ranges. Where a selective cap is positioned between first dielectric 610 and third dielectric 615, that cap may be the same material as the third conductive material. Additionally, the cap may have a first thickness between the first dielectric 610 and third dielectric 615. The third conductive material may have a second thickness different from the first thickness of the cap. The second thickness may be greater than or less than the first thickness in disclosed embodiments.

Figure 7:
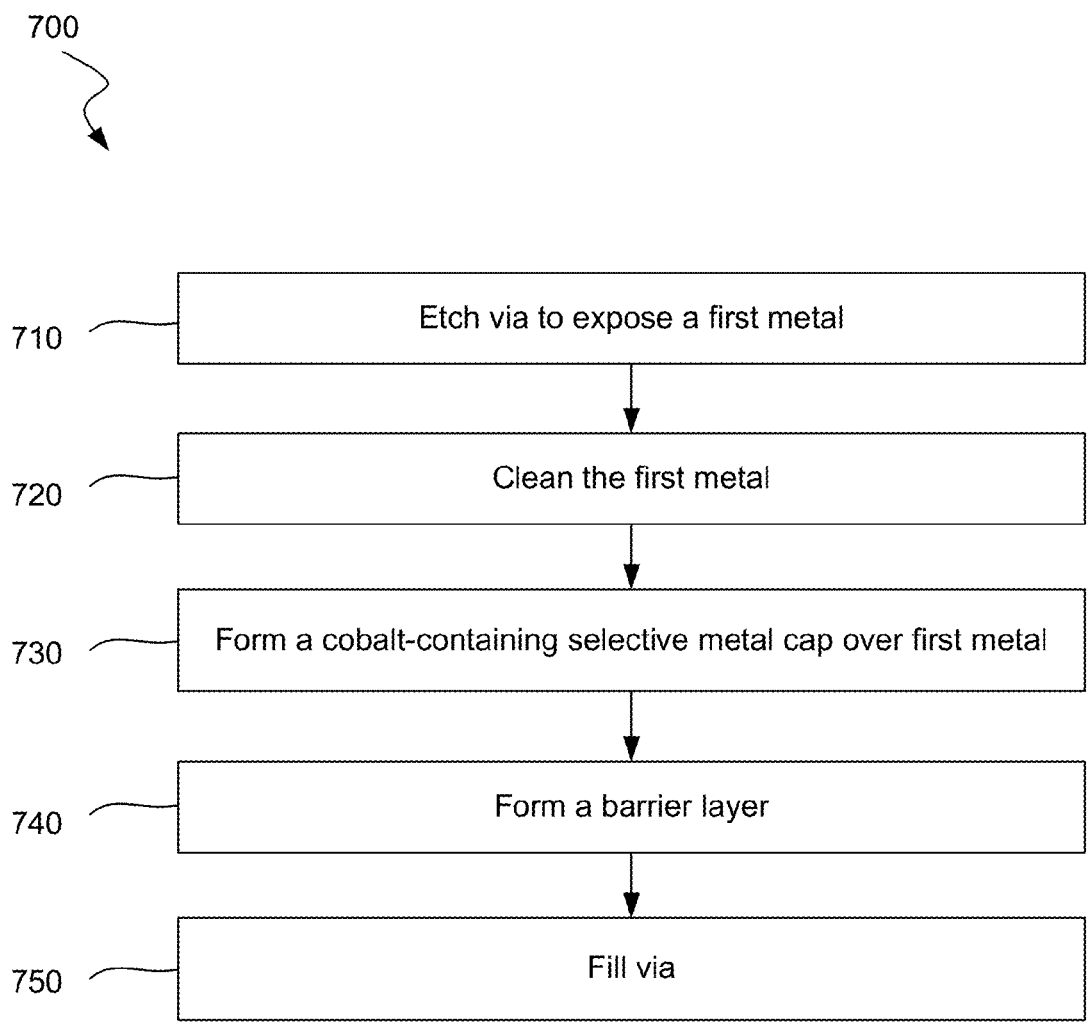
FIG. 7 shows a method of forming a selective metal cap over an interconnect metal according to embodiments of the disclosed technology.

Turning to FIG. 7 is shown a method 700 of forming a cap over an interconnect metal according to embodiments of the disclosed technology. Method 700 may include some or all of the method operations previously described, and may be performed in chamber 200, among a number of other process chambers, for example. Method 700 may be used in part or in some modified form to produce structure 600 or other structures. Method 700 includes etching a via 710 through a semiconductor structure. The structure may include at least a first circuit layer and a second circuit layer over the first circuit layer in disclosed embodiments. The etching operation 710 may be performed through the second circuit layer to expose an interconnect metal in the first circuit layer. At operation 720, the lower interconnect metal may be cleaned. Any of a number of cleaning processes may be performed including sputtering, reactive pre-cleaning that may include in situ hydrogen plasma, active pre-cleaning with ex situ hydrogen plasma, UV, or any other cleaning method that may include one or more plasma species from a variety of precursors for cleaning the surface of the underlying interconnect metal.

Method 700 may also include forming a cobalt-containing protective cap overlying the exposed first metal at operation 730. The cobalt-containing cap may be formed in any of the previously described ways. Method 700 may also include forming a barrier layer including manganese along the sidewalls of the via at operation 740. The barrier layer may be deposited overlying the cobalt-containing protective cap to a thickness of less than 50% of the thickness deposited along the sidewalls of the via. The barrier layer may have a thickness at the sidewalls of less than or about 10 nm in embodiments, and may have a discontinuous or minimal coating over the protective cap. Method 700 may also include filling the via with copper directly overlying the barrier layer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric" includes a plurality of such dielectrics, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure comprising:
   etching a via through a semiconductor structure, wherein the etching exposes a first metal;
   forming a layer of material overlying the exposed first metal subsequent the etching;
   depositing a barrier layer within the etched via, wherein the as-deposited barrier layer is characterized by a first thickness along the sidewalls of the via, and a second thickness less than the first thickness overlying the layer of material; and
   forming a second metal overlying the layer of material.

2. The method of claim 1, wherein the layer of material comprises a transition metal or a transition metal oxide.

3. The method of claim 1, wherein the layer of material is formed to a thickness of between about 0.5 nm and 10 nm.

4. The method of claim 1, wherein the via includes no other materials besides the second metal and barrier materials.

5. The method of claim 4, wherein the barrier layer comprises a transition metal.

6. The method of claim 5, wherein the barrier layer comprises manganese.

7. The method of claim 1, wherein at least one of the first metal and the second metal comprise copper.

8. The method of claim 1, wherein the first metal comprises an interconnect for a first level of a semiconductor structure, and the second metal comprises an interconnect for a second level of a semiconductor structure.

9. The method of claim 1, wherein at least a portion of the etch comprises:
   contacting a portion of the semiconductor structure with non-reactive ions from a capacitively coupled plasma; and
   exposing the contacted portion of the semiconductor structure to a plasma-generated reactive species.

10. The method of claim 1, wherein the etching is performed as an operation of a single or dual damascene process.

11. The method of claim 1, wherein the semiconductor structure is maintained under vacuum between the etching operation and the layer of material forming operation.

12. A method of forming a protective cap within an integrated circuit structure, the method comprising:
   etching a via through a semiconductor structure, wherein the semiconductor structure comprises at least a first circuit layer and a second circuit layer, and wherein the etching is performed through the second circuit layer to expose an interconnect metal in the first circuit layer;
   cleaning the interconnect metal;
   forming a cobalt-containing protective cap overlying the exposed first metal;
   forming a barrier layer comprising manganese directly contacting the sidewalls of the semiconductor structure defining the via, wherein the barrier layer is formed overlying the cobalt-containing protective cap and is characterized at the time of formation by a non-negligible thickness of less than 50% of the thickness deposited along the sidewalls of the via, and wherein the barrier layer has a thickness at the sidewalls of less than or about 10 nm; and
   filling the via with copper directly overlying the barrier layer.

13. The method of claim 1, wherein the forming a layer of material operation comprises bringing the semiconductor structure in proximity to a heating element.

14. The method of claim 13, wherein the heating element causes sublimation of byproducts.

15. The method of claim 12, wherein the cleaning comprises a UV clean.

16. The method of claim 12, wherein the cleaning comprises a reactive clean utilizing an in situ hydrogen plasma.

17. The method of claim 12, wherein the cobalt-containing protective cap is characterized by a thickness of between about 10 Å and about 40 Å.

18. The method of claim 12, wherein forming the cobalt-containing protective cap is performed prior to etching the via, and wherein the method further comprises:
   oxidizing at least a portion of the cobalt-containing protective cap after formation.

19. The method of claim 1, wherein the layer of material overlying the exposed first metal is formed to cover the exposed first metal.

* * * * *